United States Patent [19]
Sreeram et al.

[11] Patent Number: 5,858,145
[45] Date of Patent: *Jan. 12, 1999

[54] METHOD TO CONTROL CAVITY DIMENSIONS OF FIRED MULTILAYER CIRCUIT BOARDS ON A SUPPORT

[75] Inventors: Attinganal Narayanaswamy Sreeram, Plainsboro; Barry Jay Thaler, Lawrenceville; Ashok Narayan Prabhu, East Windsor, all of N.J.

[73] Assignee: Sarnoff Corporation, Princeton, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 730,594

[22] Filed: Oct. 15, 1996

[51] Int. Cl.⁶ .............................. B32B 31/18; B32B 31/26
[52] U.S. Cl. ...................... 156/89.16; 156/89.12; 156/182; 156/252; 156/253; 156/278; 156/280; 29/851; 428/210; 428/901; 174/255
[58] Field of Search .............................. 156/89, 250, 256, 156/257, 263, 277, 278, 280, 182, 252, 253, 89.12, 89.16, 89.11; 264/614, 619; 427/96, 126.2, 126.3, 126.4; 174/250, 255; 428/210, 901; 29/851

[56] References Cited

U.S. PATENT DOCUMENTS

| | | | |
|---|---|---|---|
| 4,710,250 | 12/1987 | Kojima et al. | 156/89 |
| 4,837,408 | 6/1989 | Kondo et al. | 156/89 X |
| 4,920,640 | 5/1990 | Enloe et al. . | |
| 5,085,720 | 2/1992 | Mikeska et al. | 156/89 |
| 5,130,067 | 7/1992 | Flaitz et al. | 156/89 X |
| 5,254,191 | 10/1993 | Mikeska et al. | 156/89 |
| 5,277,724 | 1/1994 | Prabhu | 156/89 |
| 5,370,759 | 12/1994 | Hakotani et al. | 156/89 X |
| 5,456,778 | 10/1995 | Fukuta et al. | 156/89 |
| 5,470,412 | 11/1995 | Fukuta et al. | 156/89 |
| 5,480,503 | 1/1996 | Casey et al. | 156/89 |
| 5,538,582 | 7/1996 | Natarajan et al. | 156/89 X |
| 5,581,876 | 12/1996 | Prabhu et al. | 156/89 X |

*Primary Examiner*—Curtis Mayes
*Attorney, Agent, or Firm*—William J. Burke

[57] ABSTRACT

Patterned laminated green tape multilayer stacks can be fired while maintaining the dimensions of the pattern by applying, as by screen printing or spraying, a ceramic ink over surface portions of the green tape stack. Complex patterns can be formed in the green tapes by punching openings in one or more of the laminated green tape stacks before laminating them together.

11 Claims, 4 Drawing Sheets

METHOD TO CONTROL CAVITY DIMENSIONS OF FIRED MULTILAYER CIRCUIT BOARDS ON A SUPPORT

This invention was made with U.S. government support under contract number DAAB07-94-C-C009. The U.S. government has certain rights in this invention.

This invention relates to a method for maintaining dimensional control of patterned multilayer circuit boards on a support during firing, and to articles made by the present method.

BACKGROUND OF THE INVENTION

Ceramic multilayer circuit boards have been used for many years for circuits for electrical apparatus. They are made by casting glass and/or ceramic powders, such as low firing temperature devitrifying glasses having a firing temperature below about 1000° C., together with an organic binder, to form a green tape. A conductive metal circuit is formed on the green tape by screen printing. These green tapes may be stacked together to form a multilayer circuit stack. The circuits on each green tape layer are connected electrically by punching via holes in the green tape, which are then filled with a conductive material. The green tapes are then aligned and pressed together, or laminated, and fired to remove the organic materials and to sinter the glass.

More recently, the green tape layers have been aligned on a conductive metal support substrate, to enhance the electrical, mechanical and thermal properties of multilayer glass/ceramic circuit boards. The multilayer ceramic green tapes are adhered to the support substrate by means of a bonding glass. Proper choice of bonding glasses can both adhere the green tape layers to the conductive support, and can suppress shrinkage of the green tape during firing in the x and y lateral dimensions. The resultant green tape stack, which shrinks up to about 20% by volume during firing, shrinks only in the z direction, that is, the vertical direction with respect to the support substrate. This eliminates problems of alignment between the green tape stack and the support substrate, and improves via hole tolerances of all substrate features.

When it is desired to pattern the green tape stacks so as to form cavities in the green tape in which, after firing, devices such as silicon chips may be placed, the presence of the support substrate has reduced the shrinkage and deformation of such cavities during firing. A prior art process has been described that shows process steps for making the cavities and for limiting their deformation during firing, as shown in FIGS. 1A, 1B, 1C and 1D.

FIG. 1A illustrates a green tape layer stack 22 having a cavity 24 formed therein. The green tape layer stack 22 is supported by a substrate support 26 and has a top layer 28 of a non-sintering ceramic material. This ceramic material can be a high sintering temperature material such as alumina.

A machined insert or cavity plug 29, such as of ceramic of the size of the cavity 24, is placed in the cavity 24 to maintain the size of the cavity during lamination and firing as shown in FIG. 1B.

After firing the laminate stack and removing the insert 29, as shown in FIG. 1C, the sintered layers 32 have shrunk only in the thickness dimension, and the top layer 28 remains intact, still slightly overhanging the fired stack 32. The layer 28 now comprises a powdered ceramic. The cavity 24 has improved dimensional stability, and has about the same dimensions as the original cavity.

FIG. 1D shows the fired green tape stack after removal of the top ceramic layer and the machined insert. The fired stack 32 having a cavity 24 therein is adhered to the substrate 26.

However, although the shrinkage in the x and y directions can be greatly reduced in accordance with the above process, there is still some shrinkage during firing in the lateral dimensions, up to about 3%, and it is difficult to retain both the shape and the size of the cavities formed in the green tape throughout the firing step. Deformation occurs because, during firing, the cavity walls flow inwardly, so that the fired cavity is smaller than the cavity originally punched in the green tape. When a cavity plug, made of a high firing temperature ceramic is placed in the cavity prior to firing in a further attempt to prevent shrinkage, the shrinkage that still occurs in the z direction also contributes to the deformation of cavity walls, and it is difficult to maintain the flatness of the cavity walls and floors because of the flow of resin and glass during the firing step. Ceramic plugs or inserts, when used, have the disadvantages that they must be separately formed, and must be separately removed from the cavities after firing. These requirements add to the number of steps required to make the patterned multilayer printed circuit board, and thus add to the costs of such a process. However, the fired shrinkage is only marginally improved, and some shrinkage still occurs in lateral directions.

Thus a method of improving the dimensional control and deformation control during lamination and firing of multilayer, patterned green tape stacks would be highly desirable.

SUMMARY OF THE INVENTION

We have found that applying a suitable ceramic composition, comprising ceramic powders mixed with an organic carrier, over the exposed surface or surfaces of a patterned green tape stack, and then laminating each stack, controls the cavity dimensions during firing. Complex patterns can be made by coating, laminating and punching a pattern in one multilayer stack, a second pattern is made in a second multilayer stack and laminated, and the patterned stacks laminated together. The ceramic-organic vehicle compositions are applied so that the final laminated stack is coated on all exposed areas. Further, this improved method of forming cavities has eliminated the problems of cavity wall deformation and lack of flatness of ledges and the bottom walls of fired multilayer circuit boards on metal support substrates.

The invention also includes fired patterned multilayer ceramic circuit boards and packages made in accordance with the process of the invention that have cavities therein of improved dimensional control.

DETAILED DESCRIPTION OF THE INVENTION

Figure 1A:
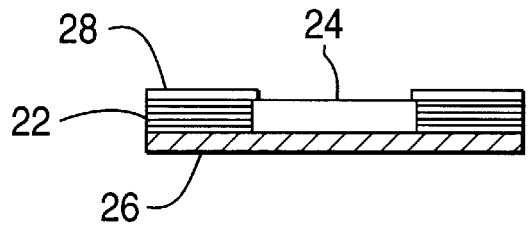
FIGS. 1A, 1B, 1C and 1D illustrate the process steps of a prior art process for maintaining dimensional control of a patterned multilayer stack on a support.
Figure 1B:
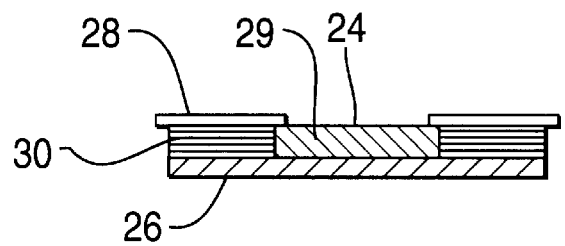
Figure 1C:
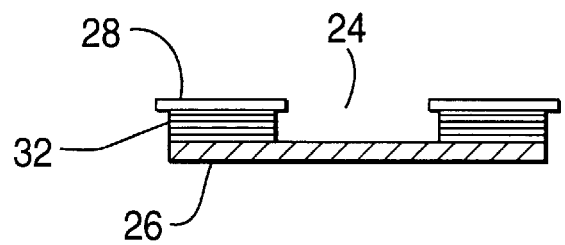
Figure 1D:
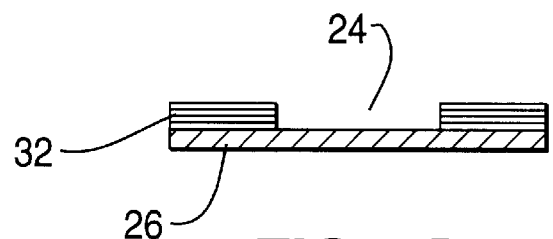

A ceramic-organic carrier composition that can be applied onto the exposed surfaces of a patterned multilayer green tape stack improves the stability of the dimensions of the patterns, such as cavities, even when they are of a complex nature, during firing.

The ceramic-organic carrier compositions can be applied to the patterned multilayer green tape stack in various ways. A thick film ink can be made that can be applied by screen printing; a sprayable mixture of a ceramic powder and a solvent, such as isopropanol, can be made; or a green tape mixture, similar to the laminated green tape multilayers used herein, can be cast, patterned and placed over the patterned layers. The printed circuits on the green tape layers are not generally disturbed by applications such as screen printing or a spraying step. However, when very dense circuitry is to be applied to the top layer, or to the ledges of patterned openings, a screen printable ceramic ink of the invention can be applied in a pattern that is the negative of the circuit pattern, thereby producing a planar layer that includes the circuit pattern and the screen printable ink that fills the spaces between the circuit pattern.

The ceramic powders useful to make the ceramic-organic carrier composition can be made from a glass, either alone or preferably mixed with a high melt temperature powdered ceramic such as crystallized or pre-fired glass, titanium oxide or aluminum oxide. For example, alumina alone, which has a high firing temperature, can be used to make the ceramic-organic carrier composition. The relative amounts of glass and high melt temperature ceramic present in the composition can vary widely. The ceramic or glass of the ceramic-organic carrier composition should have a firing temperature at least as high as that of the glass of the green tapes. When only unfired glass is used for the subject ceramic-organic carrier composition, the glass should fire at a temperature higher than the glass used to make the green tape. However, if a mixture of unfired and fired glass is used, such as an equal part mixture, the glass can be the same as that used to make the green tape. When using an unfired glass, as little as about 15 weight percent of finely divided titanium oxide mixed with the glass powder can improve the dimensional stability of a green tape multilayer stack having a cavity pattern formed therein through the firing step. Preferably, the glass used to make the ceramic-organic carrier composition is the same as the glass used to form the green tape, so that the firing schedule and firing temperatures are compatible.

A screen printable ink can be made from the above glasses or glass/ceramic mixtures by combining them with a suitable organic carrier. Screen printable inks are known and can be made from a solution of a resin binder and a solvent. Suitable resin binders are cellulose derivatives such as ethyl cellulose, and synthetic resins such as polyacrylates, polymethacrylates, polyesters, polyolefins and the like. Suitable solvents include pine oil, terpineol, butyl carbitol acetate, 2,2,4-trimethyl-1,3-pentanediol monoisobutyrate, available from Texas Eastman Company under the trademark Texanol, and the like. The organic vehicle suitably can contain about 5 to about 25 percent by weight of the resin binder. The organic vehicle can also contain a surfactant, and/or a thickener such as lecithin. The resultant screen printable ceramic ink is printed onto the patterned multilayer stack so as to coat the surfaces that will be exposed after lamination of all of the laminate green tape stacks.

A sprayable ceramic-organic carrier composition can be made by mixing the ceramic powder with a solvent such as isopropanol, and applying to the green tape stack.

The invention will be further described with reference to the Figures. FIGS. 2A, 2B, 2C, 2D, 2E and 2F illustrate the various steps of one embodiment of the present process.

Figure 2A:
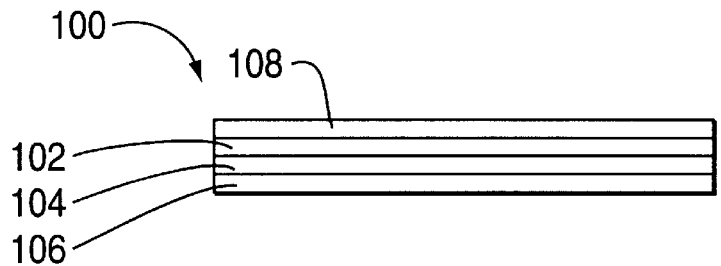
FIGS. 2A, 2B, 2C, 2D, 2E and 2F illustrate the process steps of the present invention used to make fired, supported multilayer printed circuits having patterns formed therein.
Figure 2B:
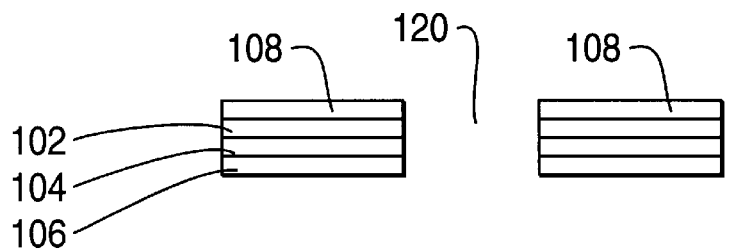

FIG. 2A illustrates a green tape laminated multilayer stack 100 having three green tape layers 102, 104 and 106, and having a screen printable ink layer 108 of the invention thereover. The layers 102, 104 and 106 are laminated by pressing at a suitable pressure and temperature to form a laminate. A cavity 120 is punched through the laminate 100 as shown in FIG. 2B.

Figure 2C:
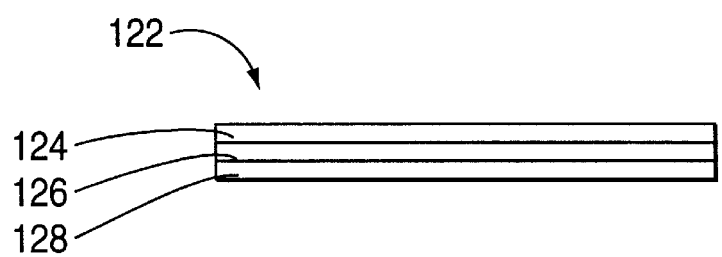

FIG. 2C illustrates an additional three layer laminated stack 122 having three green tape layers 124, 126, and 128, that have also been laminated at similar temperature and pressures.

Figure 2D:
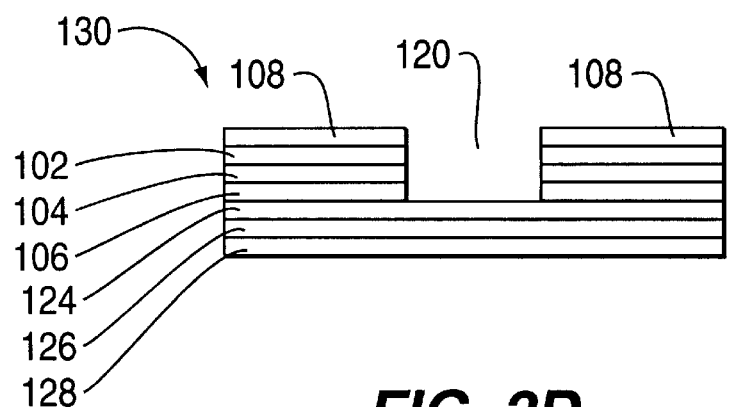
Figure 2E:
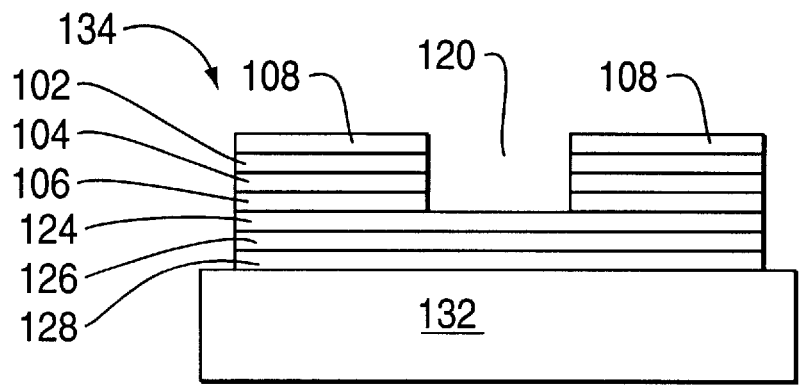

The laminated and punched stack 100 is aligned and laminated to the laminated stack 122, forming a patterned multilayer stack 130 as shown in FIG. 2D. The combined patterned stack 130 is aligned and then laminated to a metal support substrate 132 to form a patterned multilayer green tape stack 134 on a support 132, as shown in FIG. 2E. The separate laminating steps contribute to the dimensional stability of the final multilayer stack 134 on the support substrate 132.

Figure 2F:
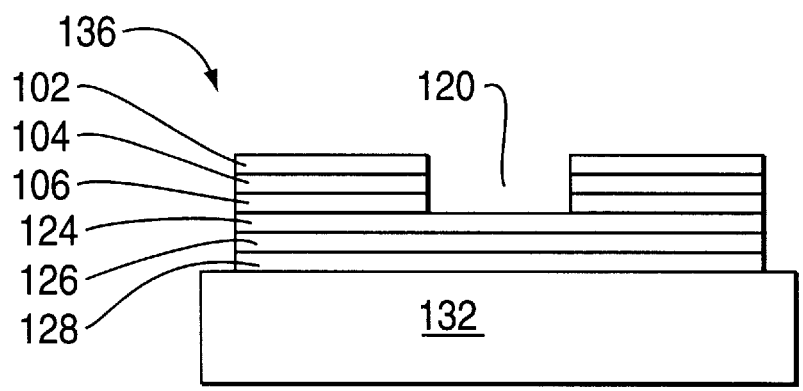

The multilayer green tape stack 134 on the support 132 is then fired to remove the organic materials in the green tapes and in the ceramic-organic carrier composition, and to sinter the glass. The fired overlying ceramic layer 108 is then removed, as by washing, to form a patterned multilayer supported multilayer circuit board 136 having improved dimensional control, as shown in FIG. 2F. The shape and the dimensions of the cavity 120 are maintained throughout the laminating and firing steps. The dimensions can be retained before firing within about 0.02% or less using the present method.

The lamination steps are generally carried out by compressing the individual green tape stacks. The load required for lamination will vary depending on the area of the green tape stack to be laminated, and the composition of the green tape. As an example, a green tape stack made from a low firing temperature devitrifying glass is laminated under a 1000–3000 pound load after preheating the stack for about one minute at about 185° F. However, other green tape materials may require a different laminating pressure and/or temperature.

Suitably, compression is performed for 30 seconds on each side of the laminate for a total heating time of about 2 minutes. After trimming the edges of the compressed one or more laminated stacks, they are heated at about 185° F. for one minute and then aligned with a metal support substrate. The prelaminated stacks and the metal support are bonded together by means of a bonding glass layer under a 500 pound load while heating for 30 seconds on each side, for a total of another two minutes heating time. The combined laminated and supported stack is then fired in conventional manner. Thus each component multilayer stack, and the final lamination of the green tape stack and its support, are preformed separately, which leads to improved dimensional stability of the fired stack.

Several examples of patterned green tape layers formed into various patterns and laminated are shown in FIGS. 3A, 3B, 3C and 3D.

Figure 3A:
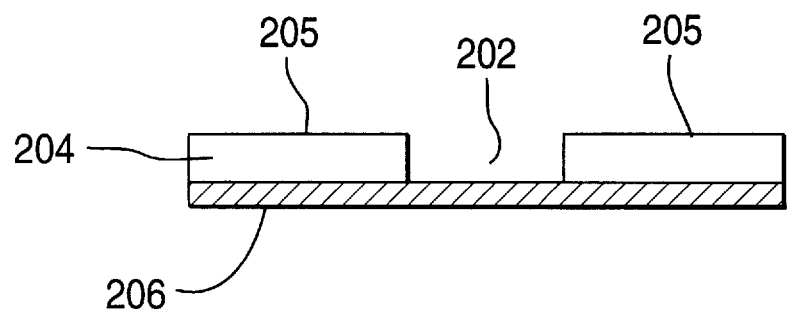
FIGS. 3A, 3B, 3C and 3D illustrate embodiments of various patterns that can be made using the process of the invention.

FIG. 3A illustrates a simple pattern of an opening 202 in a green tape layer 204 on a support 206 wherein a portion of the support 206 is exposed. The ceramic-organic composition of the invention is deposited on the surfaces 205 of the green tape layer 204.

Figure 3B:
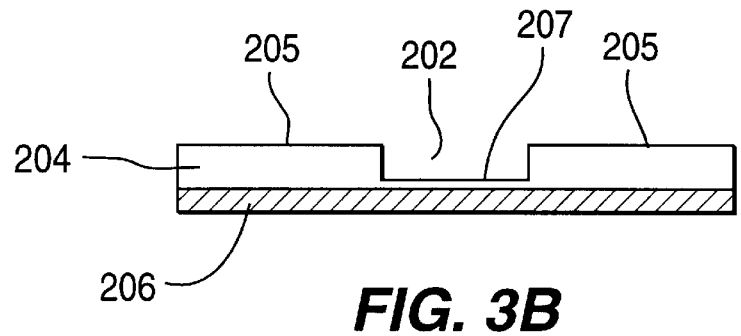

FIG. 3B illustrates an alternate pattern wherein a portion of the green tape layer 204 covers the opening 202; thus the opening 202 does not extend to the support 206 and a surface 207 is exposed. In such case the ceramic-organic composition of the invention is deposited at least on the surfaces 205 of the green tape layer 204.

Figure 3C:
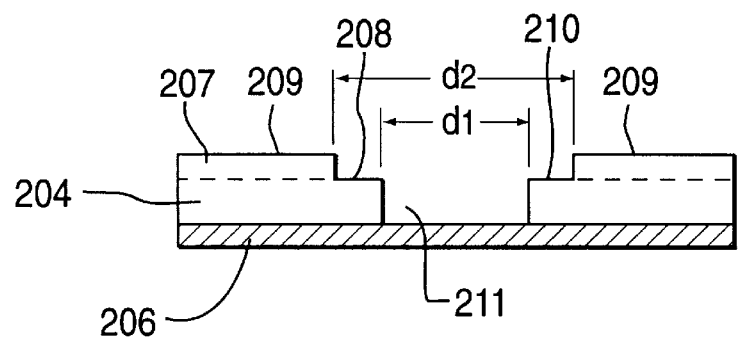

FIG. 3C illustrates a more complex alternate pattern. A first green tape layer or layers 204 are laminated and placed on a support 206. A portion 211 of the support 206 having a width d1 is exposed. A second green tape laminate 207 having a wider punched opening d2 is laminated, thereby exposing surface 209 and two ledges 208 and 210.

Figure 3D:
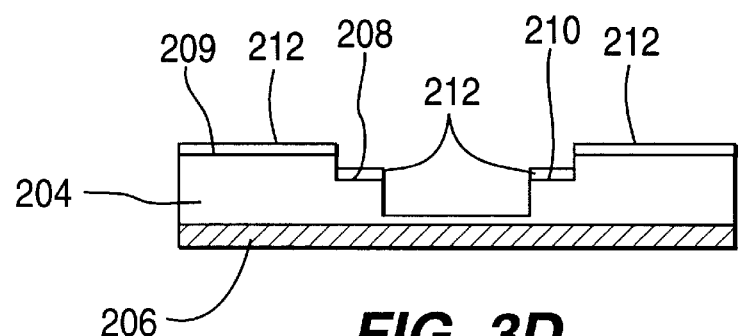

FIG. 3D illustrates the patterned stack of combined FIGS. 3B and 3C with a ceramic-organic composition 212 deposited on the upper surface 209 and the ledges 208 and 210.

Figure 4:
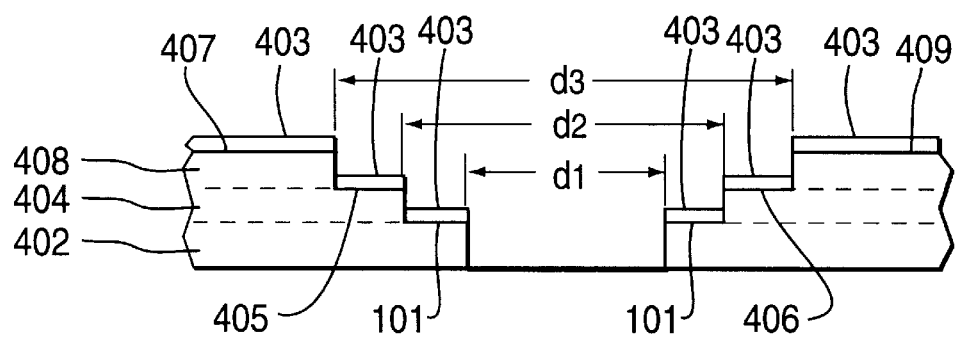
FIG. 4 illustrates another embodiment of the invention.

FIG. 4 illustrates still another prefired complex pattern of green tape laminated stacks comprising a first laminated stack 402 having an opening of width or diameter d1 and having a screen printable ink 403 over the exposed surfaces 101; a second laminated stack 404 having an opening of width or diameter d2, and having a screen printable ink 403 over exposed areas or ledges 405 and 406; and a third laminated stack 408 having an opening of width or diameter d3 and having a screen printable ink 403 over exposed areas or ledges 407 and 409.

The above are examples of patterns that can be formed in laminated green tape stacks, but many others can be made as desired depending on the final utility. For example, buried cavities can be made by forming a cavity in a green tape laminate, and an unpatterned green tape laminate placed thereover. During firing, since initially the glass in the green tape is porous, the organic materials can escape through the overlying green tape layers prior to their densification.

Thus the present method permits the formation of complex patterns and openings having excellent dimensional control using a simple process. By providing an easily applied constraining layer, great flexibility can be achieved in the shape and sizes of various openings, and complex circuit patterns can be exposed and planarized to maintain their patterns during the firing step. By pre-laminating various layers or green tape stacks, the stacks are easier to handle than unlaminated green tapes, and the overall yield is improved.

If desired, a metal coating can be applied to the openings, as by spraying, painting or by inserting a tool coated with the desired metal, such as white fill, into the cavity so that the coating remains on the walls and ledges of the pattern formed in the green tape stacks.

The above metal application is useful for example for RF shielding an integrated circuit placed within a cavity, thereby isolating the integrated circuit from the surrounding multilayer ceramic printed circuit layers, or from an adjoining integrated circuit in a nearby cavity. After the wires and external wire bonds have been formed, an external metal lid can be soldered over the cavity including an integrated circuit to isolate the integrated circuit from electrical interference generated by the surrounding printed circuits or by another nearby integrated circuit in an adjoining cavity. Conventional microwave shielding can also be done using the general principles of the present process. Vias are formed in the green tape laminate that go through the laminate to the metal support substrate.

All of the above steps are performed prior to firing, so that after firing, the desired dimensionally stable cavities are formed in the multilayer printed circuit board, metal coated if desired, and the whole adhered to a support substrate in a single firing step.

Thus complex patterns can be formed in a green tape stack by forming a pattern or opening of one dimensions in one stack and laminating it; forming another pattern of a different dimension in another stack and laminating it; aligning the laminated stacks with respect to each other and a support substrate, if employed. Further, one or more of the laminated green tape stacks may be unpatterned over or under a patterned green tape stack. In such case, the screen printable or sprayable ink is applied to all exposed green tape surfaces.

The combined laminated and coated stacks are fired in conventional manner in a single step, with the screen printable or sprayable ink layer on all exposed surfaces. Generally multilayer laminate stacks are fired by heating over a period of 4–6 hours and holding at peak temperatures, generally 800°–1000° C. depending on the glass used, for about 15–45 minutes.

A suitable screen printable ink for use in the invention can be prepared as follows. An ink vehicle can be made from 8.0 grams of a first mixture of an ethyl cellulose resin, terpineol and butyl carbitol solvent. Another suitable ink vehicle can be made from 8.0 grams of an ethylcellulose resin in terpineol and butyl carbitol solvents, to which is added 0.2 gram of lecithin and 2.0 grams of butyl carbitol. Either resin-solvent mixture is then mixed with 20.0 grams of the desired glass or ceramic. The consistency of the screen printable ink can be adjusted by adjusting the amount of organic solvents in the ink.

A green tape composition can be made from the following: 190 grams of a first glass made from 124.0 grams of magnesium oxide, 80.0 grams of aluminum oxide, 188.0 grams of silicon oxide, 4.0 grams of boron oxide and 4.0 grams of phosphorus pentoxide; 8.0 grams of a second glass made from 136.0 grams of magnesium oxide, 52.0 grams of aluminum oxide, 200.0 grams of silicon oxide and 12.0 grams of boron oxide and 2.0 grams of cordierite. The inorganic glass/ceramics are mixed together with 43 grams of a suitable resin-solvent mixture.

Three layers of the green tape having a layer of screen printable ink of the invention on top are laminated by preheating for one minute at 185° F. for one minute, followed by heating for 30 seconds on each side under a 1000 pound load.

A desired cavity pattern is punched in the tape stack.

Three additional layers of the above green tape are laminated by preheating for one minute at 185° F., followed by heating for 30 seconds on each side under a 300 pound load. The laminates are aligned and laminated to a support substrate.

Dimensional control of the cavities is maintained without the need for inserts or tools during the firing step, thereby reducing the costs of making the multilayer printed circuit stacks.

The invention will be further illustrated in the following Examples and Controls but the invention is not meant to be limited to the details described therein.

Three screen printable inks were prepared. The glass used was the same glass as was used to make the green tape.

Ink A was made of equal parts by weight of 10 grams each of powdered precrystallized glass and unfired glass from which the green tape was made, 1.0 gram of a resin-solvent mixture and 0.2 grams of lecithin.

Ink B was made in similar manner except using 17.0 grams of the glass of the green tape mixed with 3.0 grams of ultrafine titanium oxide.

Ink C was made in similar manner except using 14.0 grams of alumina having a particle size of about 11 microns, and 6.0 grams of the unfired glass.

EXAMPLES 1–2

The inks A and B were each screen printed onto multilayer tapes as shown in FIG. 2D and the laminates cofired onto a copper clad molybdenum support substrate. In Examples 1 and 2, the multilayer stack was punched to have 24 square cavities 225 mils per side.

After firing the supported multilayer stack having the screen printed ink A thereon, the average cavity size was 226.91±0.37 (about 0.85% expansion).

In Example 2, ink B was used. The average fired cavity size was 227.29±0.67 mils (about 1.0% expansion).

EXAMPLE 3

A green tape stack as in Example 1 screen printed with ink C was punched to form a complex pattern of 16 square cavities as illustrated in FIG. 3C. The widest opening d1 was 240 mils/side, and had a depth h1. A second, narrower opening d2, 180 mils/side, was punched through to the substrate 206.

After firing and removing the screen printed glass/ceramic material, the average cavity size of the larger openings d1 was 240.99±0.50 mils (about 0.41% expansion). The average fired cavity size of the smaller openings d2 was 181.18±0.51 mils (about 0.66% expansion).

COMPARATIVE EXAMPLE

The green tape stacks of Example 1, but without the screen printable ink, was punched to form a pattern of 24 cavities 225 mils/side. A group of green tape stacks had a cavity plug inserted into the cavities. The punched and fired cavity sizes are given below and compared with cavities which had alumina cavity plugs inserted therein during firing:

TABLE

| Punch size, mils | Fired size, mils | Expansion % | Fired size, using plugs | Shrinkage, % |
|---|---|---|---|---|
| 180 | 200 ± 6 | 11.1 | 178 ± 3 | about 3 |
| 225 | 250 ± 6 | 11.1 | | |
| 240 | 255 ± 6 | 6.25 | 235 ± 3 | about 3 |

Thus the present method maintains very close tolerances for cavity size during firing, and on average the difference between the maximum and minimum change in dimensions of cavities during firing is less than 0.5 percent. The change in dimension is always in the direction of expansion, rather than shrinkage. In comparison, the uncoated laminates of the Controls, with an average change in dimensions of 6–11 percent, shows that the unprotected cavities expand much more during firing.

Screen printing the ink of the invention onto exposed portions of patterned multilayer stacks maintains the flatness of the pattern ledges and bottom layers, if any, throughout the lamination, co-lamination (to the support substrate) and firing steps.

When particularly dense circuitry is to be used on the top and ledges of patterned multilayer stacks, the ink of the invention can be screen printed in a pattern that is the negative of the circuit pattern. Thus a planar layer of the circuit and the ink is obtained that is maintained throughout the firing schedule. In such case, it is preferred that at least about 30% by weight or more of a crystallized or pre-fired glass is used to make the screen printable ink of the invention.

Although the invention has been described in terms of specific embodiments, various changes to the materials used and the firing schedule can be employed as will be known to one skilled in the art, and are meant to be included herein. The invention is only to be limited by the scope of the claims appended hereto.

We claim:

1. A method of forming a multilayer printed circuit board bonded to a metal support substrate and having a cavity punched therein comprising
   a) applying a composition of a screen printable composition comprising a glass/ceramic powder selected from the group consisting of a glass, a ceramic and mixtures thereof and an organic vehicle to the to top layer of a green tape stack said glass/ceramic powder having a firing temperature at least as high as the glass of said green tape;
   b) laminating the green tape stack;
   c) punching a cavity through the laminated green tape stack; and
   d) laminating the stack obtained in step c) to a metal support substrate having bonding glass thereon; and
   e) firing above the sintering temperature of the glass of the green tape.

2. A method of forming a patterned multilayer printed circuit board comprising
   a) preparing a ceramic screen printable ink;
   b) screen printing the ceramic ink over the top layer of a multilayer green tape stack;
   c) laminating the green tape stack;
   d) punching a cavity in the laminated green tape stacks; and
   e) firing the multilayer laminated green tape stack.

3. A method of forming complex patterns in a multilayer printed circuit board comprising
   a) separately laminating a plurality of ceramic green tape stacks;
   b) punching a cavity in one or more of said stacks;
   c) aligning and laminating said stacks together;
   d) applying a glass/ceramic powder selected from the group consisting of a glass, a ceramic and mixtures thereof in an organic vehicle to exposed surfaces of said laminated stack; and
   e) firing said stack.

4. A method according to claim 3 wherein said laminated multilayer ceramic green tape stack of step c) is bonded to a metal support substrate.

5. A method according to claim 3 wherein said powder is a mixture of the glass and fired glass used to make the green tape.

6. A method according to claim 3 wherein said powder is aluminum oxide.

7. A method according to claim 3 wherein said powder is a mixture of the fired glass of the green tape mixed with titanium oxide.

8. A method according to claim 3 wherein conductive metal circuit patterns are on exposed surfaces and applying the glass/ceramic composition of step d) so as to form a planar layer over said conductive metal circuit patterns.

9. An article made by the method of claim 1.

10. An article made by the method of claim 2.

11. An article made by the method of claim 3.

* * * * *